United States Patent
Ohshima et al.

(10) Patent No.: US 6,888,138 B2
(45) Date of Patent: May 3, 2005

(54) ABSORPTION CURRENT IMAGE APPARATUS IN ELECTRON MICROSCOPE

(75) Inventors: Takashi Ohshima, Higashimurayama (JP); Hiroshi Makino, Kokubunji (JP); Hiroshi Toyama, Hachioji (JP); Hiroyuki Shinada, Mitaka (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/868,907

(22) Filed: Jun. 17, 2004

(65) Prior Publication Data

US 2005/0045820 A1 Mar. 3, 2005

(30) Foreign Application Priority Data

Aug. 25, 2003 (JP) .......................... 2003-299477

(51) Int. Cl.$^7$ .................. H01J 37/28; H01J 37/244
(52) U.S. Cl. ................. 250/310; 250/306; 250/397; 250/398; 250/396 R
(58) Field of Search ................ 250/310, 306, 250/397, 398, 396 R

(56) References Cited

U.S. PATENT DOCUMENTS

| | | | | |
|---|---|---|---|---|
| 5,430,292 A | * | 7/1995 | Honjo et al. | 250/310 |
| 5,557,105 A | * | 9/1996 | Honjo et al. | 250/310 |
| 6,657,193 B2 | * | 12/2003 | Dan et al. | 250/310 |

OTHER PUBLICATIONS

K. Yamada et al, "An In–Line Contact and Via Hole Inspection Method Using Electron Beam Compensation Current", IEDM Technical Digest, 1999, pp., 483–486.

* cited by examiner

Primary Examiner—Nikita Wells
(74) Attorney, Agent, or Firm—Mattingly, Stanger, Malur & Brundidge, P.C.

(57) ABSTRACT

It was hard for conventional SEMs to take measurements at a high speed and take accurate measurements when an insulator exists between an object to probe and the detector, because the conventional SEMs used a continuous electron beam. Also, it was impossible to apply voltage to the sample during the measurement of current. By pulse-modulating the electron beam and extracting a high-frequency signal component from the sample, new SEM equipment disclosed herein detects electrons absorbed in the sample at a high speed and with precision. Precise and high-speed absorption current measurements can be achieved. High-functionality inspection apparatus can be provided.

13 Claims, 9 Drawing Sheets

DETECTION MODULE CIRCUIT

ABSORPTION CURRENT IMAGE APPARATUS IN ELECTRON MICROSCOPE

CLAIM OF PRIORITY

The present invention claims priority from Japanese application JP 2003-299477 filed on Aug. 25, 2003, the content of which is hereby incorporated by reference on to this application.

BACKGROUND OF THE INVENTION

The present invention relates to an electron beam apparatus and, more particularly, to an absorption current image measurement apparatus suitable for sample measurement and inspection with an electron microscope.

In scanning electron microscope (SEM) inspection using an electron beam in a semiconductor process, essentially, measurements are taken for secondary electrons from a sample. However, a problem was presented that, for deep holes and trenches with a narrow width or samples with a nonuniformly charged surface, secondary electrons from the surface irradiated with a probe electron beam cannot be measured sufficiently. As prior art means to solve this problem, for example, there is a sample measurement method using absorption current, K. Yamada, et al., described in IEDM Technical Digest, 1999, pp. 483–486. According to this method, which is illustrated in FIG. 2, absorption current measurements are taken by irradiating the surface of a sample 4 with a continuous electron beam 1 and connecting a current-voltage converter circuit between the sample substrate and a ground electrode 0.

SUMMARY OF THE INVENTION

To determine the impedance of a sample accurately, it is necessary to take accurate measurements of a frequency characteristic of absorption current. However, to obtain an accurate absorption current value, it is required that DC signal be measured without the intervention of an insulator film or the like between an object to probe and the signal detector. In this respect, in the prior art absorption current measurement method, measurable samples are limited in structure; i.e., an insulative substrate and a substrate with an oxide film on the back for which accurate absorption current frequency characteristic measurements cannot be performed.

In the prior art example, a retarding method which decelerates an incident electron beam by applying a high voltage to the substrate cannot be used because the sample and the current measuring circuit are directly connected, and there was a problem that high-resolution observation is impossible at low acceleration. This is because, in a low acceleration region, a chromatic aberration of an objective lens becomes large, which results in resolution degradation. In the retarding method, when the electron beam passes the objective lens, its acceleration voltage is increased to reduce the chromatic aberration and decelerates to a desired acceleration voltage immediately before the beam strikes the sample. This technique is essential for achieving a high resolution at low acceleration.

Furthermore, in the current measuring arrangement using the continuous electron beam 1 and the current-voltage converter circuit, it is required to integrate measured current values to reduce noise of a constituent amplifier and electron beam scans for capturing an image must be performed at a low speed. This posed a problem that high-speed measurement is hard to do.

In order to solve the above problems, in an electron microscope apparatus for microscopic observation by irradiating a sample with an electron beam, a means for modulating the electron beam and a means for measuring a modulation frequency component of current which is absorbed in the sample are provided.

Through the use of the present invention, absorption current measurement can be performed at a high speed and with a high precision and, thus, the invention is very useful for use in semiconductor inspection equipment.

An advantage resides in that information about internal portions of the sample is obtained and, thus, internal structures and defects can be observed in a nondestructive manner, which was impossible in the prior art method.

It becomes possible to observe even wet samples and samples vulnerable to electron bombardment at a high resolution in a low vacuum atmosphere.

DETAILED DESCRIPTION OF THE PREFERRED EMBODIMENTS

[Embodiment 1]

Figure 1:
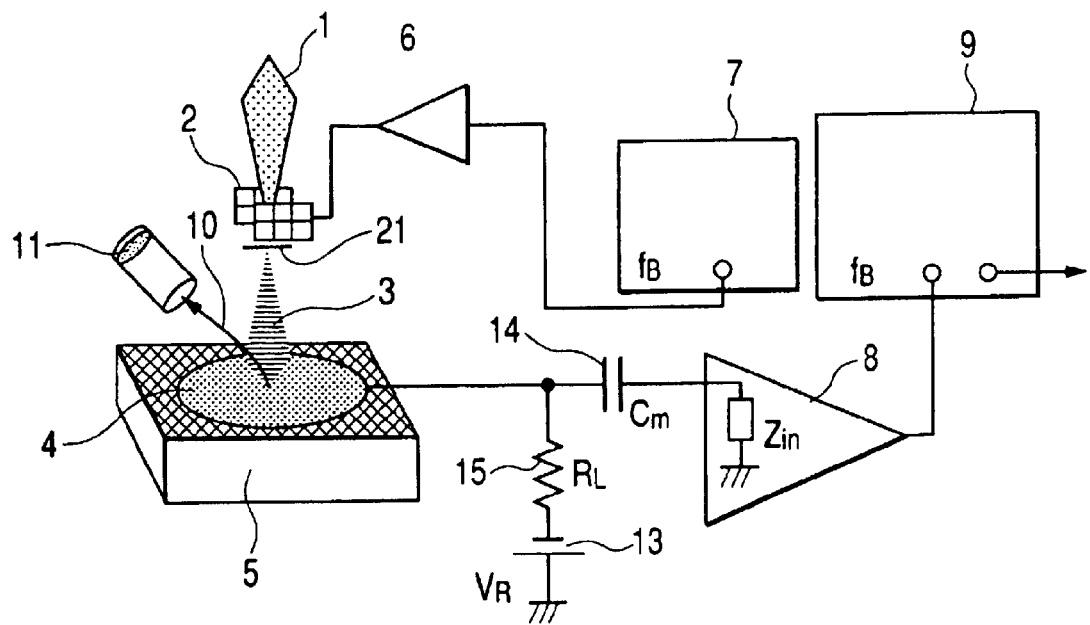
FIG. 1 is a schematic diagram of SEM equipment according to Embodiment 1 of the present invention.

FIG. 1 shows a schematic of SEM equipment according a preferred Embodiment 1 of the invention. In the scanning electron microscope (SEM) equipment, a continuous electron beam 1 is produced and converted to a pulse electron beam 3 through blanking electrodes 2 and a blanking slit 21 located in the beam passage. The blanking electrodes 2 are flat parallel and a pulsing voltage generated by a blanking amplifier 6 is applied to one of the electrodes with the other serving as a ground electrode or inverse voltages are applied to both the electrodes. The voltage to be applied is determined by acceleration voltage and an electric field produced between the blanking electrodes 2, which is conditioned that the voltage application causes the electron beam to bend, and hence the beam cannot pass the slit 21. A pulse cycle is determined by a pulse generator 7 and a pulse voltage generated by the pulse generator is amplified by the blanking amplifier 6 and applied to the blanking electrodes 2. A sample 4 is placed on a sample stage 5. When the electron beam strikes the sample 4, absorption current is produced in the sample by the electron beam.

Wiring electrically connected to the sample is separated into two paths. If the sample stage 5 is not well insulated from the ground, a leak path of absorption current signal flowing into the sample 4 is formed and measured signal intensity decreases. Thus, the sample stage 5 must be well insulated from the ground terminal.

The role of a load resistor $R_L$ is to form a current path for low-frequency current diverging from a current path between a preamplifier 8 and the sample 4. Therefore, the load resistor $R_L$ is located in parallel with the current path between the preamplifier 8 and the sample 4 and one end thereof is grounded. In consequence, current $I_a$ absorbed by the sample by electron beam irradiation is converted to voltage $-I_a R_L$ by the load resistor 15. In the case of FIG. 1, particularly, the retarding power supply 13 is located between the ground terminal and the load resistor $R_L$.

The other end of the load resistor high frequency signal serves as a high-frequency signal extracting means 14 and is connected via a coupling condenser $C_m$ in series to the preamplifier 8. In consequence, a high-frequency component of voltage with a frequency of $f_B$ generated in the load resistor 15 is extracted from the preamplifier 8. Instead of the coupling condenser, a high pass filter or a band pass filter that allows a current component comprising a modulation frequency of the electron beam to pass may be located. If the high pass filter is used, a filter having a cut-off frequency smaller than the modulation frequency of the electron beam is used.

Output of the preamplifier 8 is guided through a band pass filter 9 to an image input of the SEM and an absorption current image is presented on a display. Preferably, the preamplifier 8 has input impedance $Z_{in}$ greater than the resistance value $R_L$ of the load resistor 15. When normal SEM viewing is performed, a secondary electron detector 11 is used to measure the intensity of secondary electrons.

Figure 2:
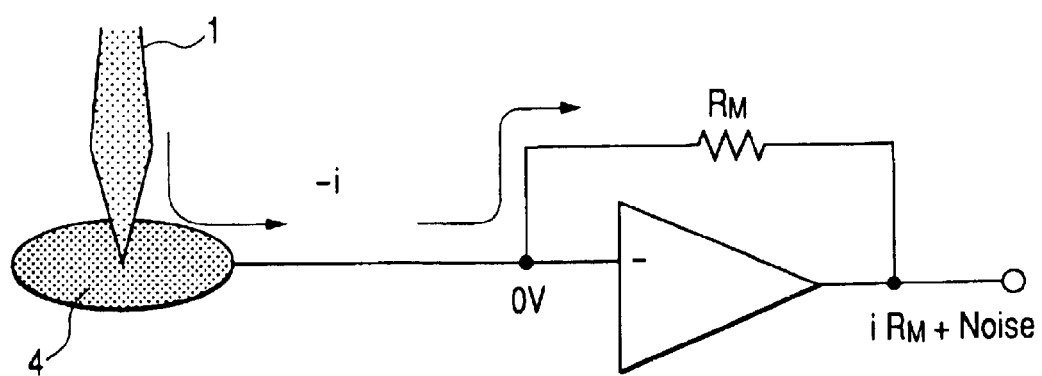
FIG. 2 is a schematic diagram of a prior art example.
Figure 3A:
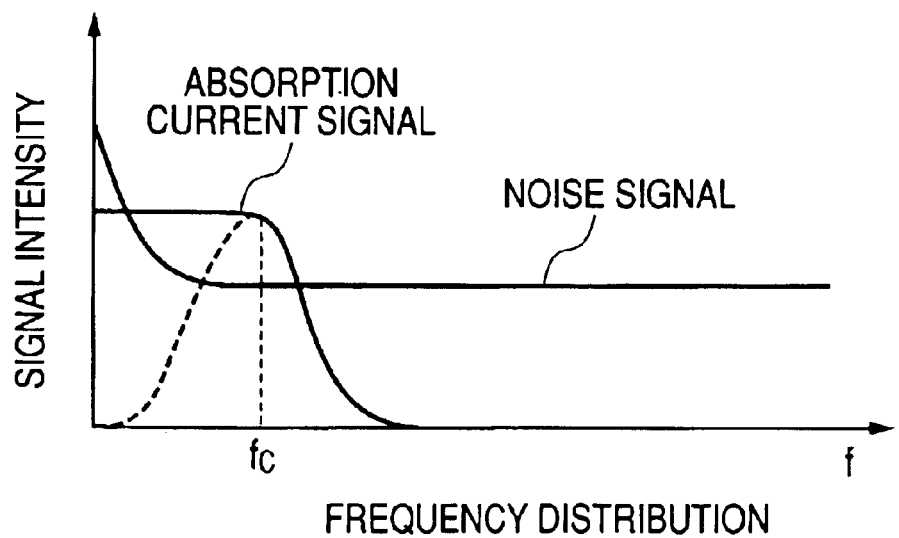
FIG. 3, which is comprised of FIGS. 3A and 3B, shows graphs to explain Embodiment 1 of the invention in comparison with the prior art.
Figure 3B:
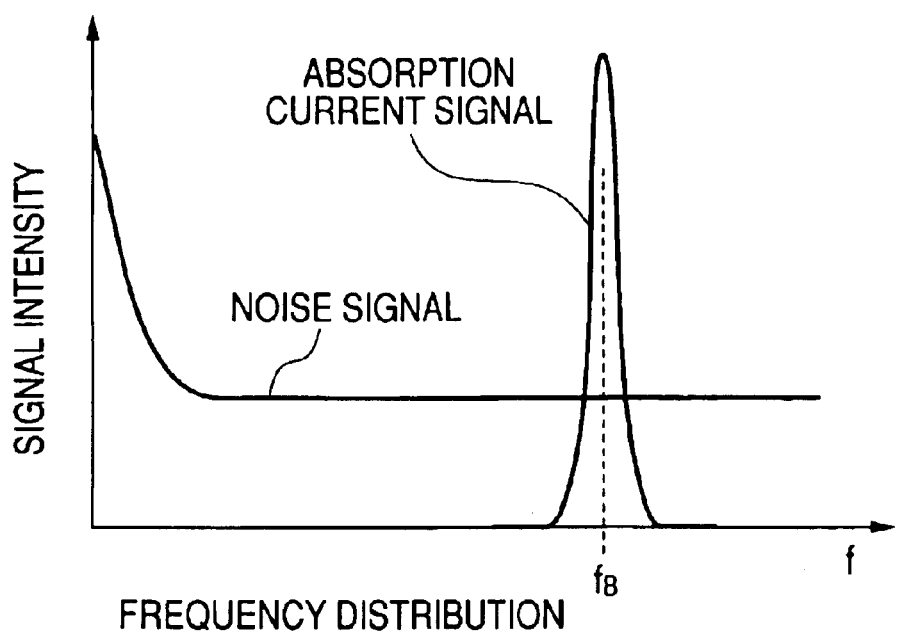

FIG. 3A and FIG. 3B show relations between signal intensity and noise signal intensity for the prior art example and for Embodiment 1. In the case of the current measuring method of prior art as illustrated in FIG. 2, as shown in FIG. 3A, noise signal produced by the measuring circuit has a wide frequency distribution, whereas absorption current signal is distributed in a low frequency region around a cut-off frequency $f_C$ which is determined by scan speed and a probe diameter. Here, the diameter of an area where the electron beam strikes the sample is referred to as the probe diameter. When viewed from a point on the sample, electron beam pulses with a width equaling the probe diameter/scan speed strike the sample at a time. In order to selectively measure absorption current from the noise, it was necessary to scan slowly to decrease the frequency $f_C$ and insert a low pass filter to cut a high-frequency component of the noise signal. For example, with the low pass filter having a time constant of 10 seconds, it took four minutes to scan a screen containing 512×512 pixels. Here, the pixel is a minimum unit of cells of horizontal and vertical partitions of a screen. Size 512×512 means that a full-screen image consists of 512 pixels in the vertical direction by 512 pixels in the horizontal direction, a total of 262144 pixels.

Furthermore, for an insulator substrate and other samples which do not carry DC, a low-frequency component of the signal is missing, as indicated by a dotted line in FIG. 3A. Consequently, the following problem was presented: sensitivity becomes worse and an S/N ratio cannot be expected to increase, because the signal intensity decreases with the decrease of the frequency $f_C$, and it becomes impossible to observe some sample. By contrast, when the SEM equipment of Embodiment 1 shown in FIG. 1 is used, absorption current signal is found around a blanking frequency $f_B$ of the electron beam, as shown in FIG. 3B. By using a band pass filter with its center frequency tuned at $f_B$, noise can be reduced effectively and the signal with a high S/N ratio can be obtained. Moreover, because DC components are not necessary, the SEM equipment of Embodiment 1 has a merit that it is able to take measurements at a high speed.

Figure 12:
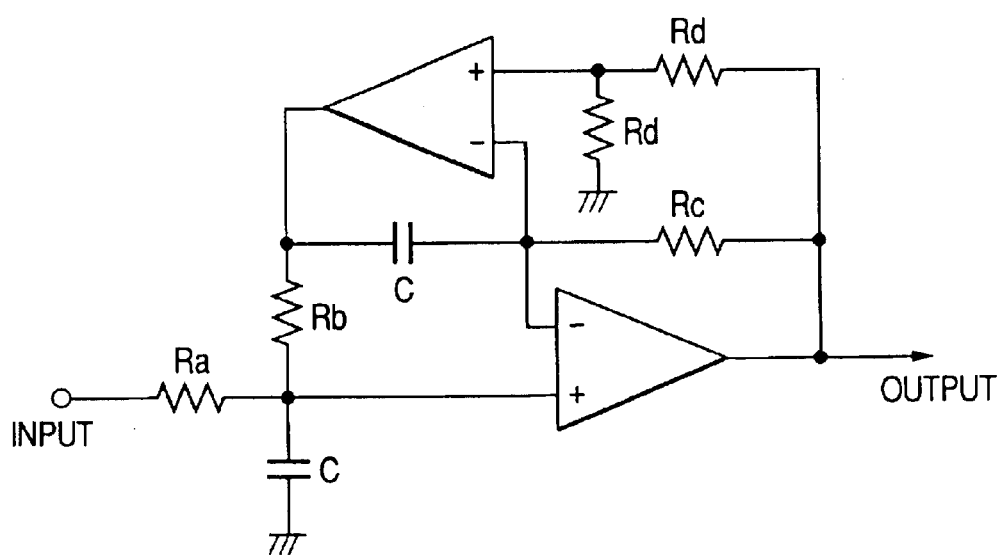
FIG. 12 shows an example of a band pass filter.

As for the band pass filter, a filter having a high Q-value, such as a multiple feedback type, dual amplification type, and bi-quad type is preferable. Particularly, the dual amplification type is suitable in terms of the S/N ratio, high-frequency characteristic, and Q-value. An example of the band pass filter is shown in FIG. 12. Here, the center frequency is $1/(2\pi C (Rb\ Rc)^{1/2})$ and a Q-value is determined by $Ra/(Rb\ Rc)^{1/2}$. For example, to select a Q-value between 100 and 300, it is advisable to make Ra variable. The center frequency is variable, depending on C, Rb, and Rc.

While output signal of the band pass filter 9 is processed by the SEM, it may also be preferable to add a wave detector circuit, a peak detector circuit, and the like before the SEM to extract only amplitude data from the signal and input it as an image signal to the SEM.

Figure 4A:
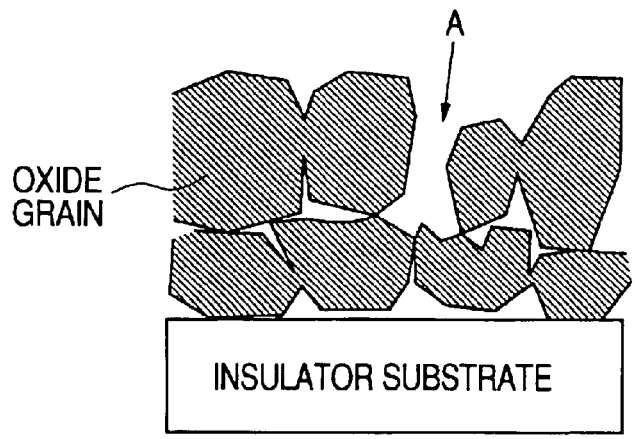
FIG. 4, which is comprised of FIGS. 4A, 4B, and 4C, shows examples of samples observed by the SEM equipment of Embodiment 1.
Figure 4B:
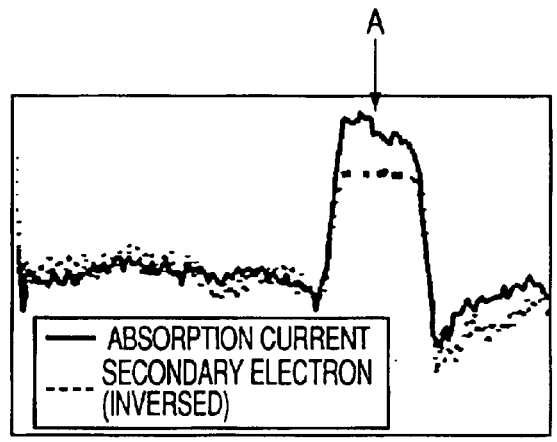
Figure 4C:
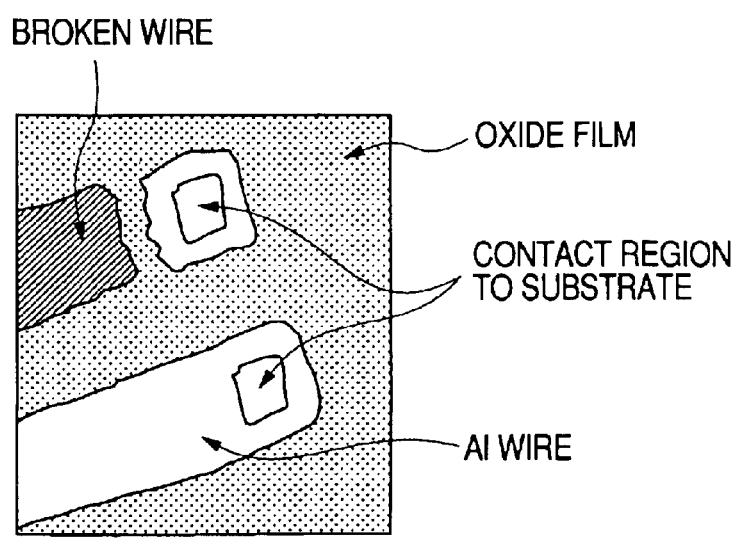

FIGS. 4A, 4B, and 4C show examples of samples observed, according to Embodiment 1. A cross-sectional structure of a sample is shown in FIG. 4A where a polycrystalline oxide is found on the insulator substrate with a local deep hole as indicated by A. If this sample is observed by normal SEM viewing, based on detecting secondary electrons, with the electric field due to charge-up of the surface of the oxide, secondary electrons generated at the bottom of the hole are hard to detect by the secondary electron detector and, thus, data about internal structures cannot be obtained.

A broken line in FIG. 4B represents a secondary electron signal distribution in the case of electron irradiation with acceleration energy of 3 kV and a probe current of 10 nA. On the other hand, when a rise in the absorption current was measured at a high speed by the SEM equipment of Embodiment 1, a contrast of the signal reflecting a detail structure at the bottom of the hole A can be obtained as indicated by a solid line in FIG. 4B. If an attempt is made to obtain an absorption current image by the prior art method, a sufficient image cannot be obtained for a corresponding measurement time, because the S/N ratio of the absorption current signal from the insulator sample is low. In this case, it takes one second to perform measurement for one screen consisting of about 300,000 pixels. Absorption current corresponds to electrons introduced by irradiation, probe electrons from which emitted secondary electrons and back scattered electrons are subtracted. From this fact, the reason why the detail structure was observed in the absorption current image is thought to be due to that the SEM equipment obtained data for the secondary electrons and back scattered electrons that did not reach the secondary electron detector. FIG. 4C illustrates a result of observing an absorption current image of Al wires, where it is seen that an Al lead whose overall image has a bright contrast is connected to the substrate via a contact region. On the other hand, a broken Al lead which is floating above the oxide film is observed to have a dark contrast. In this case, a perceptible difference between the above two leads does not appear in their secondary electron images. A primary reason is accounted for as follows: difference between the two leads residing in whether or not the absorption current easily flows across the lead was observed as the contrast difference. When this measurement is continued longer, for example, 10 times as long as the above measurement time, it is observed that difference between the secondary electron image and the absorption current image becomes small. It was thus found that a time constant required for detection must be selected appropriately. Because the absorption current can be detected at a high speed, using the SEM equipment of Embodiment 1, this device has a merit that it is able to take measurements with optimal conditions. While the surface wiring example is shown in FIG. 4C, even if a wire under the film is broken because of a defect such as void, the broken wire can be located by observing the exposed portion of the wiring.

Figure 5A:
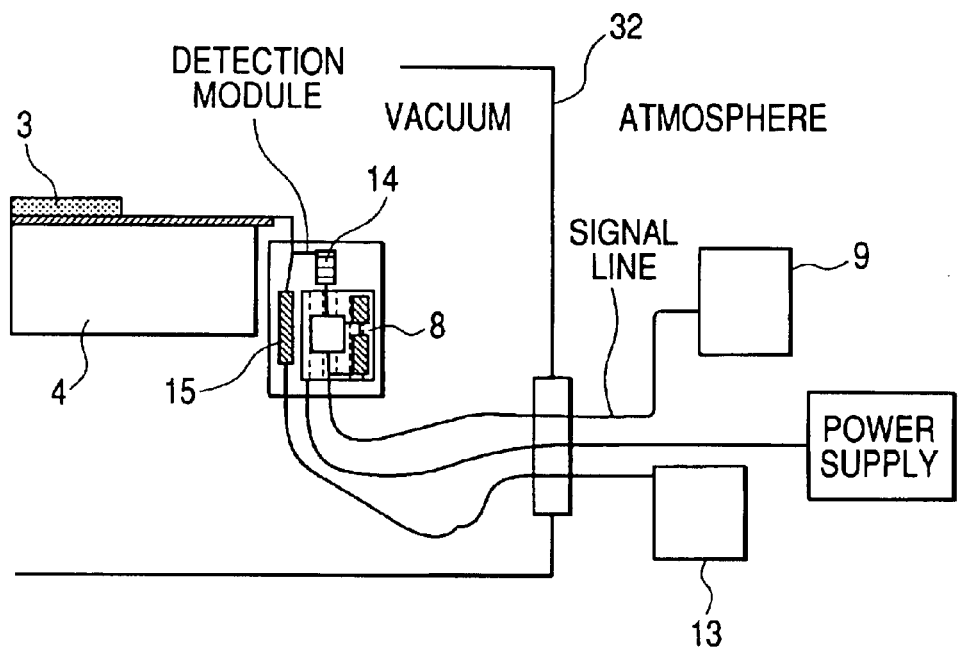
FIG. 5, which is comprised of FIGS. 5A and 5B, shows an equipment configuration including a detection module according to Embodiment 1.
Figure 5B:
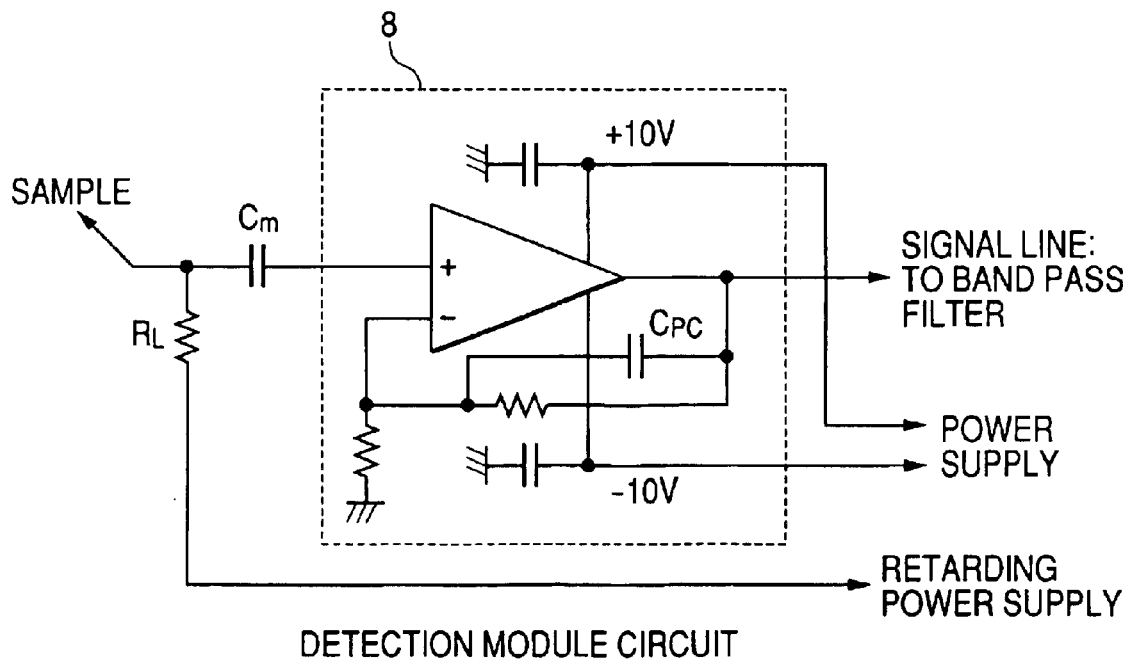

For high-speed measurements, it is advisable to reduce stray capacitance between the preamplifier 8 and the sample 3. For example, it is advisable to position a detector module near the sample within a vacuum chamber 32 as is shown in FIG. 5A. In this example, as the leads to the external, three lines are required: retarding power supply 13, amplifier power supply, and signal line. FIG. 5B shows a detector module circuit diagram. The preamplifier is comprised of an IC (AD8001), feedback resistors, and power supply line bypass condensers. If operation becomes unstable, a condenser $C_{PC}$ for phase compensation should be introduced, when appropriate. It is advisable to install the condenser $C_{PC}$ in a position to decrease the gain in order to prevent oscillation in a high-frequency region. If an operational amplifier is equipped with a terminal for phase compensation, it is also advisable to connect the condenser $C_{PC}$ to that terminal.

Gain is selectable between a factor of 10 to a factor of 10,000 and, normally, applicable between a factor of 100 to a factor of 1,000. The whole detector module is sealed in resin, because it is used, placed in the vacuum atmosphere. The characteristics of the preamplifier are as follows: input equivalent noise: 2 nV/√Hz, input resistance: 10 MΩ, and input capacitance Cin: about 2.5 pF including IC's input capacitance and stray capacitance. The value of coupling condenser Cm should be equal to or more than the capacitance of the measuring circuit and its impedance should be lower than the input impedance Zin of the preamplifier, and capacitance is selectable from a range of several pF and above and applicable in a range from 100 pF to 10 nF. The resistance value of the load resistor $R_L$ must be selected as required, because sensitivity and speed depends on this value. If a wider range is required, it is advisable to install a plurality of load resistors and change the resistance value by a selector. Alternatively, it is advisable to use a variable resistor and control its value by a control means.

Then, conditions subject to which the resistance value of the load resistor $R_L$ should be selected are described. As described above with regard to FIG. 3B, measurement sensitivity is determined by voltage produced by electron beam and the S/N ratio of the measuring circuit. Given that voltage produced by electron beam corresponds to the probe current $I_P$, in the case of continuous electron beam, the intensity of signal input to the preamplifier is proportional to $I_P R_L$. However, in the case that the signal is modulated by frequency $f_B$, further improvements of sensitivity cannot be expected when the value of $R_L$ is larger than impedance $1/(2\pi C_{in} f_B)$ determined by the input capacitance Cin of the preamplifier 8 including stray capacitance. Thus, the upper limit of $R_L$ is about $1/(2\pi C_{in} f_B)$. For example, when $f_B$ is 1 MHz in this circuit, an optimal value of $R_L$ is about 64 kΩ.

If an electron gun that gives a large probe current is used as a beam source, the signal intensity increases. In this case, the upper limit of $R_L$ is determined from an optimal range of input voltage of the preamplifier relative to the probe current $I_P$; for example, in the case of $I_P$=100 nA, RL=100 MΩ or below is desirable. For high speed measurements optimal values of the load resistor $R_L$ and associated measurement speeds and probe currents are listed in Table 1.

TABLE 1

| Probe current | Load resistance RL | Frequency upper limit | Measurement time for one image |
|---|---|---|---|
| 10 pA | 140 kΩ | 470 kHz | 560 ms |
| 100 pA | 29 kΩ | 2.2 MHz | 120 ms |
| 1 nA | 6.3 kΩ | 10 MHz | 26 ms |
| 10 nA | 1.4 kΩ | 47 MHz | 5.6 ms |
| 100 nA | 290 Ω | 220 MHz | 1.2 ms |

The upper limit of high-speed measurement is determined by a time constant depending on the resistance value of the load resistor $R_L$ and the input capacitance Cin; i.e., $f=1/(2\pi C_{in} R_L)$. Thus, the smaller the load resistance $R_L$, better will be the high-frequency characteristic. However, it is required to optimize the load resistance $R_L$ to ensure the signal voltages 10 times larger than noise voltages in the measuring circuit, because sensitivity decreases. Noise voltage $V_{noise}$ is determined by equation 1.

$$V_{noise} = V_{pre}\sqrt{\frac{f_B}{Q}} \quad \text{(Equation 1)}$$

Here, the input equivalent noise of the preamplifier $V_{pre}$=2 nV/√Hz and the Q-value of the band pass filter 9 is on the order of 100. When the measurement signal 10 times larger than the noise is preferable, a constraint that will be specified below is obtained. Although a signal-to-noise ratio of 10:1 was assumed here, based on a reasonable measurement precision to about 10%, a larger S/N ratio should be used, if a higher precision is required.

$$I_P R_L \geq 2 \times 10^{-9} \sqrt{f_B}$$

Optimal load resistances derived from this constraint and the above upper limit of $R_L$, $1/(2\pi C_{in} f_B)$, and associated upper limit frequencies and time that is taken to carry out the measurement to obtain image data for one screen containing 512×512 pixels are listed in Table 1. It is understandable that, as the probe current is multiplied, the measurement can be performed at a very high speed. Because such an optimum load resistance varies, depending on an S/N ratio required, stray capacitance of the circuit, and preamplifier characteristics, it is most effective to determine an optimal load resistance for a circuit configuration to be applied and use the circuit.

Figure 7:
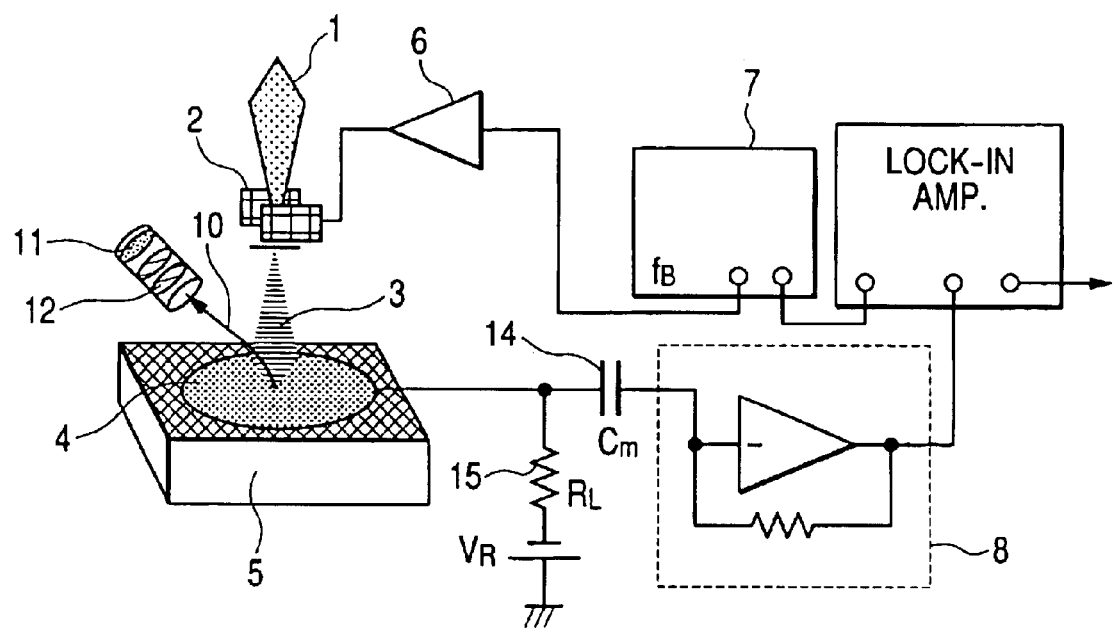
FIG. 7 is a schematic diagram of a measuring circuit according to Embodiment 2.

While the band path filter is used for high-speed measurements in this example, a lock-in amplifier as is shown in FIG. 7 may be used. Using the lock-in amplifier, phase-sensitive detection of the output of the preamplifier with a reference signal with the frequency $f_B$ from the pulse generator 7 boosts the Q-value of the band-pass filter to 100 and above, a maximum of the order of 10 raised to the seventh power. Thus, absorption current measurements with a very good S/N ratio and high precision can be performed. However, to boost the Q-value, it is a key to assign a large value to the time constant of a low pass filter of the lock-in amplifier and, therefore, a lower measurement speed is effective.

Figure 10A:
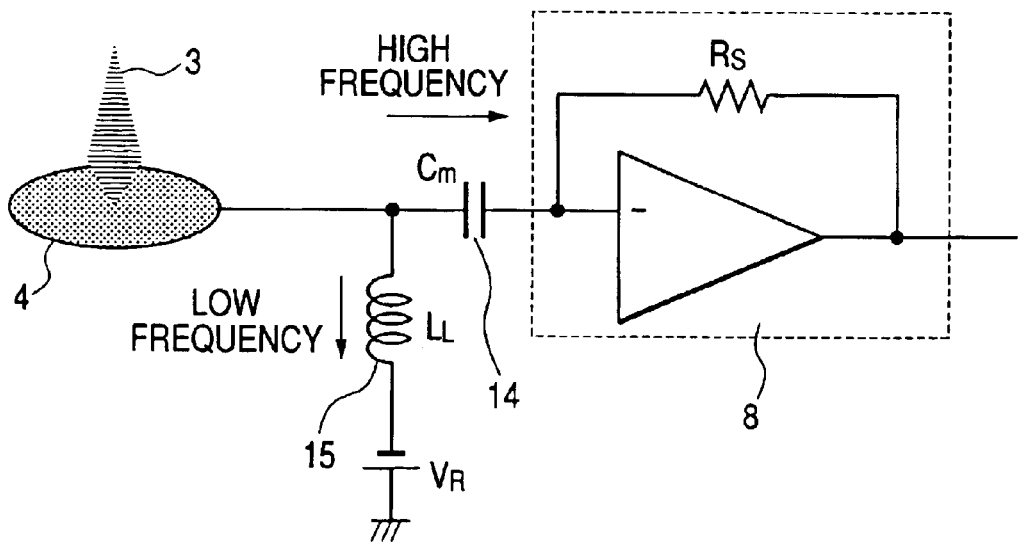
FIG. 10, which is comprised of FIGS. 10A and 10B, shows a detector circuit according to Embodiment 2.
Figure 10B:
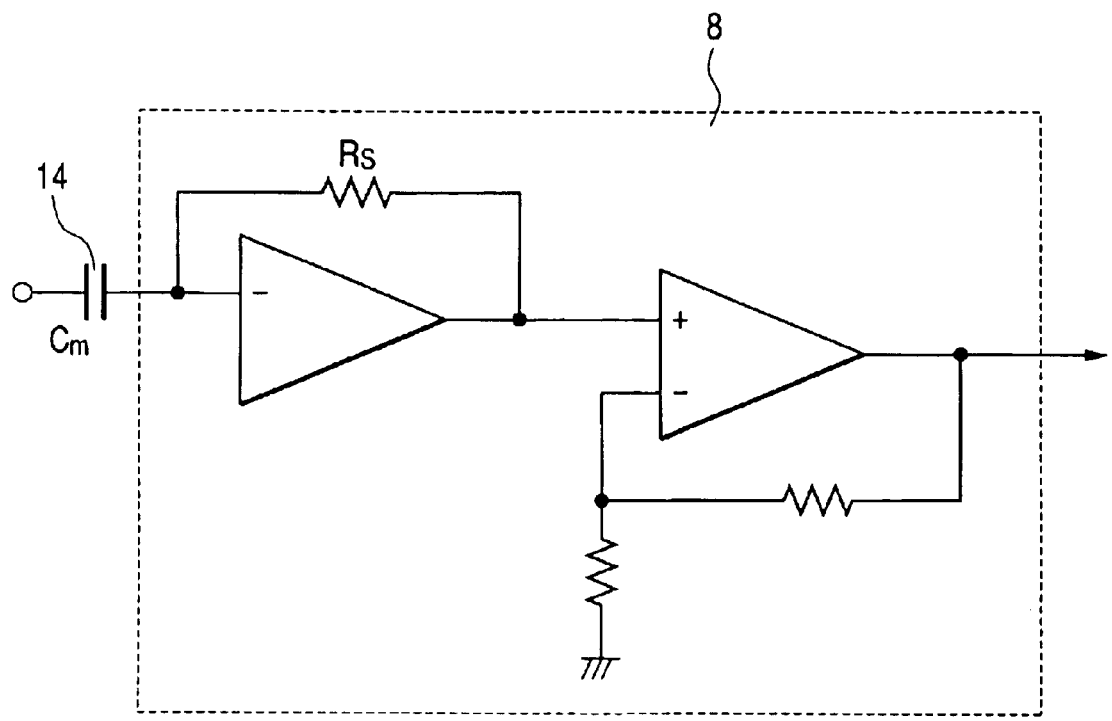

While, in Embodiment 1, the resistor $R_L$ is used as the load resistor 15, it is essentially required for the resistive element to produce an intended voltage with high-frequency current input and it is possible to use a coil or a combination of a coil and a resistor which are connected in series or parallel, for example, as is shown in FIG. 10A, to produce the same effect. For the coil-resistor combination, a combined impedance of the resistor and coil is used instead of the above-described resistance. While, in Embodiment 1, a non-inverse voltage amplifier circuit is used as the preamplifier 8, it is essentially required for the preamplifier to amplify the high-frequency component of the signal and it is possible to use an inverse current-voltage converter circuit, for example, as is shown in FIGS. 10A and 10B, to produce the same effect. The term "inverse" means that the polarity of output signal is opposite to the polarity of input voltage signal.

In the case of using the inverse current-voltage converter as the preamplifier, because the input impedance of the amplifier is low, its advantage resides in that it can reduce the effect of stray capacitance for a relatively large sample. While, in Embodiment 1, the electrode for applying a retarding voltage is used, the load resistor 15 can be grounded directly if the retarding voltage is not applied; in that case also, the same effect as Embodiment 1 is produced. In that case, the coupling condenser may be removed.

While, in Embodiment 1, the sample is irradiated with the pulse electron beam 3, on-off pulses should not necessarily be used and other forms of the electron beam may be used if the basic frequency components of current produced by the electron beam are unchanged, and a quantity of probe current modulated by frequency $f_B$ produces the same effect. For example, it is possible to use a W filament, LaB6 heating electron source as the electron source and modulate the electrode voltage internal to the electron gun. For example, it is possible to modulate the current in a condenser lens; in that case, a period when the electron beam forms a small spot on the surface of a sample is the on period and a period when the spot has become larger by a decrease in the beam current density is the off period. Alternatively, a photoexciting electron source which produces electrons by light ray irradiation may be used as the electron source; in that case, the electron beam can be modulated by light intensity, thus dispensing with an electron optic device for blanking.

[Embodiment 2]

Figure 6:
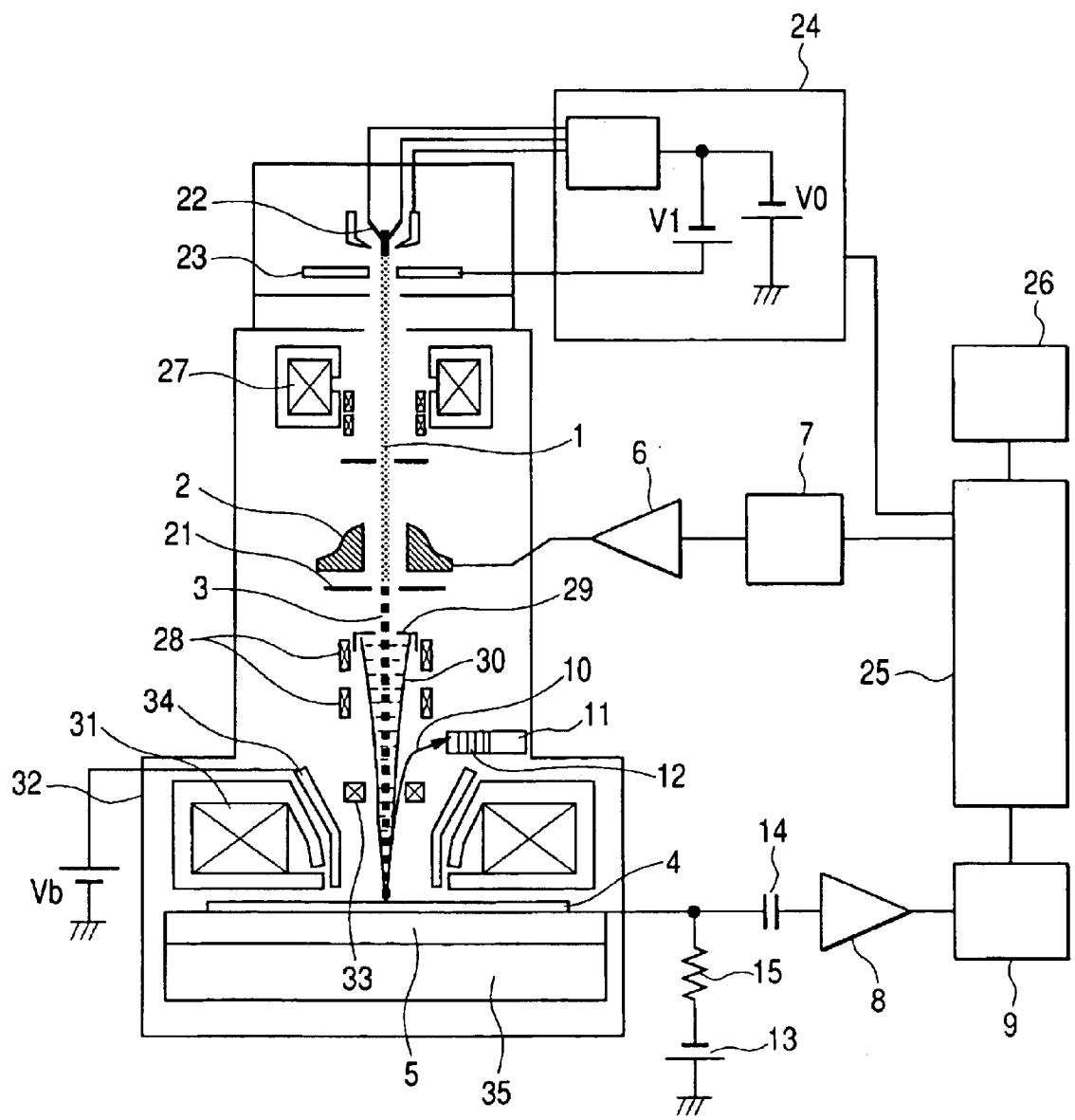
FIG. 6 is a schematic diagram of SEM equipment according to a preferred Embodiment 2 of the present invention.

FIG. 6 shows a schematic of SEM equipment according a preferred Embodiment 2 of the invention. This SEM is intended to inspect semiconductor wafers as samples with an acceleration voltage decreased to the order of 1 kV for measurement with a low possibility of damaging the sample under inspection. An electron source 22 is a diffusion-supply-type electron source using Zr/O/W and, by application of an extraction voltage V1 between extractor electrodes 23 and itself, generates a continuous electron beam 1 with electronic energy V0. An electron source controller 24 exerts control of the electron source and communicates information with a SEM controller 25. The lens action a condenser lens 27 focuses the continuous electron beam 1 around blanking slits 21. To blanking electrodes 2, a blanking voltage is applied and this voltage is an intended voltage to which a blanking amplifier converts pulses generated by a pulse generator 7. Information such as blanking frequency $f_B$ and a voltage value is sent/received by communication with the SEM controller 25. When an image is captured, a blanking signal between successive electron beam scans is also issued from the SEM controller 25. A pulse electron beam 3 generated here are bent by deflectors 28, according to scan signal, converges through objective lenses 31, and strikes the sample 4. A retarding power supply 13 applies a retarding voltage Vr to the sample 4 and, consequently, when the electron beam strikes the sample, its energy is V0−Vr; this energy is applicable in a range from −50 V to −3 kV and, particularly, preferable in a range from −800 V to −1.2 kV. Moreover, booster electrodes 34 are provided to reduce chromatic aberration in the objective lenses.

Secondary electrons 10 emitted from the sample 4 pass through the objective lenses 31, which are driven by an electric field produced by the retarding voltage, are bent by an ExB filters 33, and arrive at a secondary electron detector 11. At the inlet of the secondary electron detector 11, energy filters 12 are provided so that secondary electron energy distribution can be measured if necessary or only electrons having energy more than a certain level can be measured. Back scattered electrons 30 emitted from the sample have higher energy than the secondary electrons and, consequently, are moved higher and detected by back scatter electron detectors 29. Electrons absorbed by the sample 4 separates into a component which flows through a load resistor 15 into the retarding power supply 13 as absorption current and a component which flows through a coupling condenser and detected by a preamplifier 8. From output of the preamplifier, a frequency $f_B$ component is separated by a band pass filter 9 and processed as image signal by the SEM controller. The center frequency of the band pass filter is set to match the blanking frequency $f_B$ by the SEM controller 25. Secondary electron signal, back scattered electron signal, and absorption current signal obtained in this equipment are individually displayed or computed if appropriate and displayed as a microscopic image, inspection image, measured value, etc. on a display 26.

By viewing the thus displayed image, a Si wafer with a diameter of 300 mm as the sample 4 is observed, and it becomes possible to observe an electrical fault, broken wire, void, or other defect at the bottom of a deep hole. Particularly, for a sample in which a defect is easily detected by the back scattered electron signal, new information can be obtained by comparing the absorption current signal and the signal detected by the back scattered electron detectors. Such comparison is performed within the SEM controller 25 or a separate signal processing device may be provided; in that case, a configuration suitable for higher-speed measurement can be provided. For example, a merit of this embodiment resides in obtaining information such as sidewall angles. This is very useful for making decision of whether or not a wafer product is acceptable by the sidewall angle. In addition, check and feedback by resist and etching process conditions become quick. In previous practice, to obtain sidewall angle information, it was necessary to cut a sample and observe its cross-section shape and, therefore, it took several hours and longer and much labor to do so. As for the size of the sample 4, the equipment of this embodiment can accommodate any size of samples if the sample size is fit for the dimensions of a sample stage 5, sample transfer mechanism 35, and vacuum chamber 32.

Figure 8:
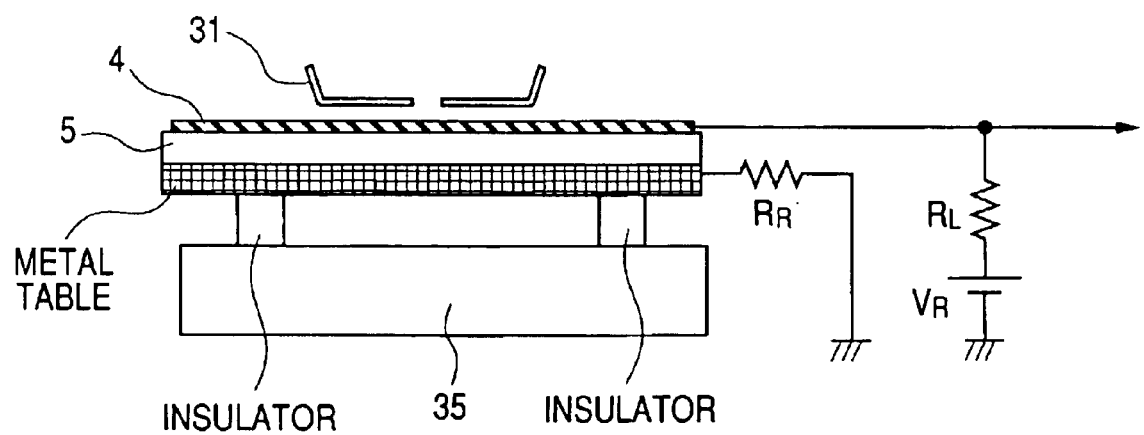
FIG. 8 is schematic diagram of a sample stage according to Embodiment 2.

In the SEM configuration of Embodiment 2, stray capacitance between the sample 3 and the objective lenses 31, vacuum chamber 32, and sample stage 5 is as large as several hundred pF or more. To reduce the capacitance, it is effective to sandwich an insulator between the sample stage 5 and sample transfer mechanism 35 on which the sample stage 5 is mounted and connect a metal plate electrode under the bottom surface of the sample stage 5 via a resistor $R_R$ to the ground, as is shown in FIG. 8. In this case, time it took to take measurements by using the same detector circuit as shown in FIG. 5 is as follows: 10 sec. when probe current $I_P$=1 nA, 1 sec. when probe current $I_P$=10 nA, and 0.1 sec. when probe current $I_P$=100 nA.

Moreover, a detector circuit which is shown in FIG. 10A can be used in the SEM configuration in which the stray capacitance of the sample is large. In that case, because the detector sensitivity is high even if the input impedance of the preamplifier is low, the effect of the stray capacitance is reduced and measurements can be taken at a high speed. A sense resistor $R_S$ resistance value may be selected in a range from 100 Ω to the order of 1 GΩ, depending on the quantity of the probe current. In this case, the upper limit of speed is determined by the amplifier characteristics and the resistance value of the sense resistor $R_S$. The smaller the resistance, higher will be the speed. However, signal intensity decreases and, therefore, a minimum resistance of the sense resistor $R_S$ is determined by a ratio of the signal intensity to the noise of the amplifier. An optimum value of this relationship should be found and applied in the same way as described in Embodiment 1. Preferably, a resistance selected between 100 Ω and 100 kΩ may be used. If the output voltage of the preamplifier 8 decreases, because the resistance of the sense resistor $R_S$ is set small, a second-stage voltage amplifier can be added, as is shown in FIG. 10B, which is effective in respect of that it can reduce the effect of external noise.

Figure 9A:
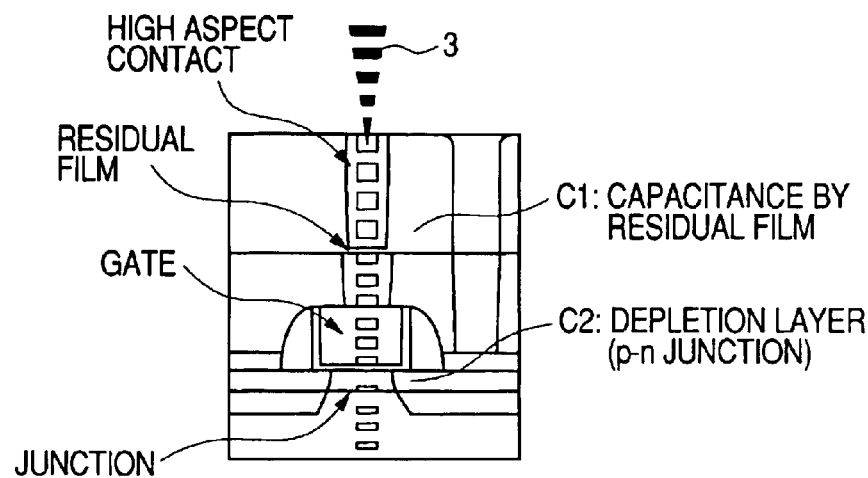
FIG. 9, which is comprised of FIGS. 9A, 9B, and 9C, shows examples of measurements obtained by the SEM equipment of Embodiment 2.
Figure 9B:
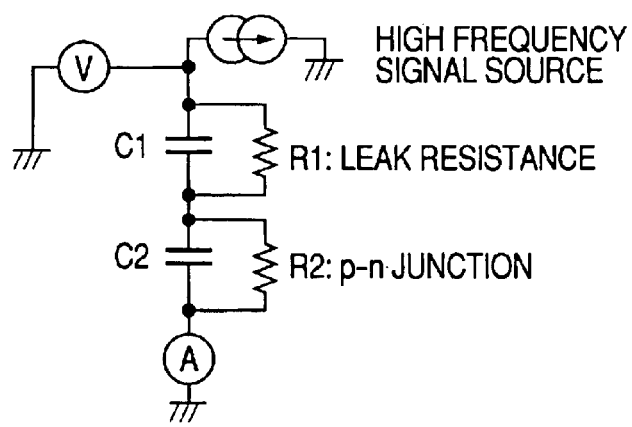
Figure 9C:
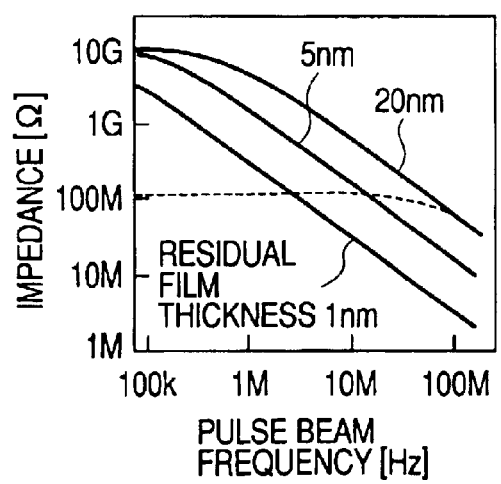

FIG. 9 shows examples of measurements obtained, according to Embodiment 2. When measurements are taken for a semiconductor sample having a cross-section structure, shown in FIG. 9A, using the SEM equipment of Embodiment 2, an equivalent circuit which is shown in FIG. 9B is generated from the measurements. The signal source is a high frequency constant current source produced by incident electrons and its intensity is equivalent to the quantity of probe current from which secondary electrons and back scattered electrons are subtracted. An ampere meter corresponds to the current measuring method according to Embodiment 2. A voltmeter can be provided by measuring the potential of the sample surface area where secondary electrons are emitted with the combination of the secondary electron detector 11 and energy filters 12. Condensers and resistors respectively correspond to capacitance C1 and leak resistance R1 of a residual film in a contact region and capacitance C2 and resistance R2 of a p-n junction in FIG. 9A. Here, because the conjunction capacitance C2 is sufficiently large, C1 and R1 are governing factors for the impedance of the equivalent circuit. Particularly, for a sample with a contact area of 0.2 $\mu m^2$, it was found that the residual film thickness in a defective portion is distributed between 1 nm and 20 nm. From a relative permittivity of 3 of the residual film and from the quantity of absorption current and potential measured at given frequencies, impedance values were obtained and plotted in impedance-frequency graphs of solid lines in FIG. 9C. Thereby, we were able to know the film thickness that remained in a non-destructive manner. Impedance values based on actual measurements are obtained by dividing the high-frequency component of potential by the absorption current. Meanwhile, a relation between impedance and frequency f in FIG. 9C is expressed as $R1/(1+4\pi^2 f^2 C1^2 R1^2)^{1/2}$. Particularly, for a straightforwardly declining line region at higher frequency can be approximated by $1/(2\pi f\, C1)$ and, therefore, a value of C1 can be obtained from frequency f, measured impedance. From a relation, C1=relative permittivity of residual film× permittivity in the vacuum atmosphere×contact area/ thickness of residual film, and, by measurement results, the residual film thickness can be known. For another contact region, we took impedance measurements at two or more different frequencies and obtained a broken line in FIG. 9C. From this result, it is found that the leak resistance R2 of the junction decrease to the order of 100 MΩ, whereas the residual film in the contact region is 20 nm thick. Calculations of the above-mentioned equations and the like are executed by the SEM controller 25 in the SEM equipment shown in FIG. 6. The SEM controller 25 includes a memory and a data table which describes the relations as illustrated in FIG. 9C is stored in the memory. If the data table becomes large, it may also be preferable to provide a dedicated database separately in the SEM equipment and read the data table from the database.

From the above description, an advantage of the present invention resides in that internal structures can be checked and electrical information thereof can be obtained in a non-destructive manner by applying the present invention. By applying the present invention, even if an insulator film or an insulative substrate exists between an object to probe and the detector, absorption current measurements can be taken, because high-frequency signal is propagated by capacitance coupling.

[Embodiment 3]

Figure 11:
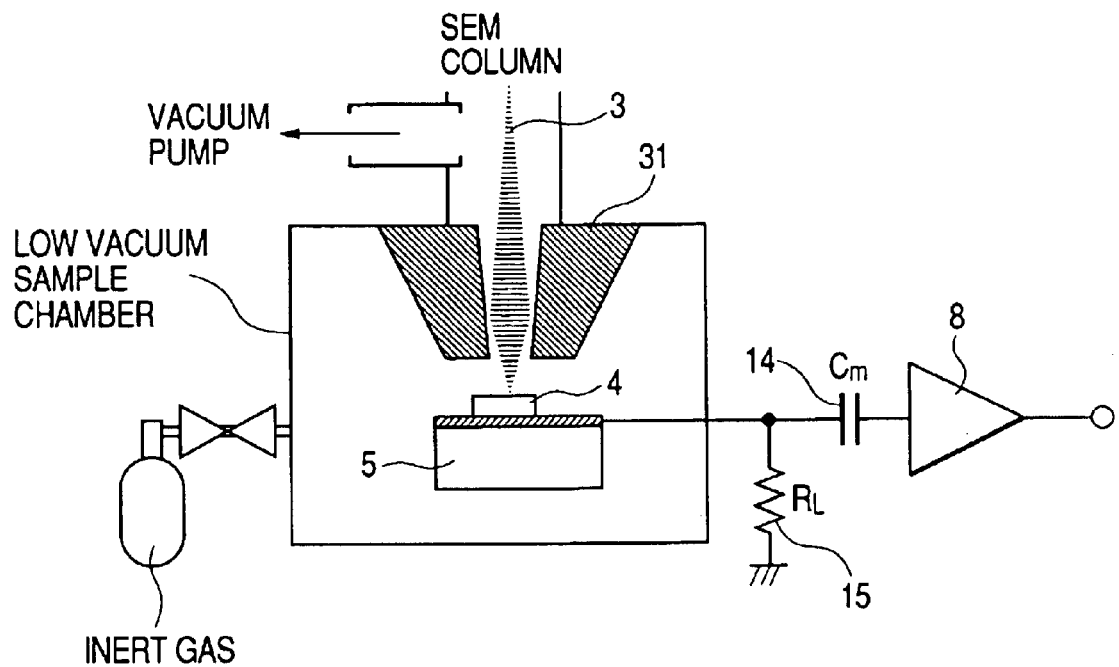
FIG. 11 is a schematic diagram of SEM equipment according a preferred Embodiment 3 of the present invention.

FIG. 11 is a schematic diagram of SEM equipment according a preferred Embodiment 3 of the invention. The SEM equipment of Embodiment 3 which is provided as an absorption current image apparatus is intended to observe samples in a low vacuum atmosphere, which is suitable for observing wet organic matters such as living bodies and protein or semiconductor samples. In Embodiment 3, the pressure of a vacuum sample chamber ranging from 270 Pa to atmospheric pressure is referred to as low vacuum. Acceleration voltage falls between 1 kV and 30 kV.

Absorption current measurements are not affected by the degree of vacuum even in the prior art method thereof. However, absorption current measurements in a low vacuum environment are not practical, because of low sensitivity and time consumption. In such an environment, mainly, measurements were taken for back scattered electrons. In this case, because back scattered electrons are lost when they collide with gas in the sample chamber, practically measurable gas pressure is upward limited to the order of 270 Pa. In contrast, by application of the present invention that enables absorption current measurements at a high sensitivity and at a high speed, practical observation at 270 Pa and above has become possible.

The absorption current measurement of the invention is effective for use with the pressure of the vacuum sample chamber ranging from 270 Pa to around the atmospheric pressure. In view hereof, the equipment is constructed to minimize pulse electron beam scattering by gas. Specifically, the objective lenses 31 are located to form a narrow and long beam hole and a vacuum pump passage is provided in the lower part of a SEM column. It is effective that an inert gas container is provided to introduce inert gas into the sample chamber and produce an atmosphere where ionization by the electron beam hardly occurs. The SEM column which has the same structure as shown in FIG. 1 makes the pulse electron beam 3 converge to strike the sample 4. Signal is drawn from the conductive layer covering the surface of the sample stage 5 and absorption current signal is measured by the load resistor 15, coupling condenser, and preamplifier 8.

Previously, to observe a wet sample, replacement by DMSO or the like and cooling the sample were required, which, however, are dispensed with by way of the present invention, because the pressure of the sample chamber can be set high. It becomes possible to observe a sample that is more like its natural state. As described above, because measurements can be taken even by applying the retarding voltage, even samples vulnerable to electron bombardment can be observed at a high resolution, using a low acceleration voltage of the order of 1 kV, and this feature of the invention is useful for observing protein and organic substance structure.

What is claimed is:

1. In an electron microscope apparatus for microscopic observation by irradiating a sample with an electron beam, an absorption current image apparatus comprising:
    a means for modulating said electron beam by a given frequency;
    a means for irradiating said sample with the modulated electron beam; and
    a means for measuring a modulation frequency component of current produced by said electron beam in the sample.

2. The absorption current image apparatus in the electron microscope according to claim 1, further comprising:
    a separation means for separating said produced current into a high-frequency component comprising said modulation frequency and a low-frequency component with a frequency lower than said high-frequency component, located between said sample and said means for measuring said modulation frequency component.

3. The absorption current image apparatus in the electron microscope according to claim 2, wherein said low-frequency component comprises a DC component.

4. The absorption current image apparatus in the electron microscope according to claim 2, further comprising:
    a preamplifier located between said separation means and said means for measuring said modulation frequency component;
    a condenser located on a current path between an input terminal of the preamplifier and said sample; and
    a resistor connected in parallel with the current path between the condenser and said sample,
    wherein the condenser and the resistor constitute said separation means.

5. The absorption current image apparatus in the electron microscope according to claim 2, further comprising:
    a preamplifier located between said separation means and said means for measuring said modulation frequency component; and
    a condenser located on a current path between an input terminal of the preamplifier and said sample; and
    a coil connected in parallel with the current path between the condenser and said sample,
    wherein the condenser and the coil constitute said separation means.

6. The absorption current image apparatus in the electron microscope according to claim 5, wherein said resistor consists of a variable resistor or a plurality of resistors having different resistance values and the absorption current image apparatus further includes a selection means to select a resistance value of the variable resistor or one of the plurality of resistors.

7. The absorption current image apparatus in the electron microscope according to claim 1, wherein said means for modulating said electron beam comprises a pulse generator, a pulse amplifier, blanking electrodes, and blanking slits.

8. The absorption current image apparatus in the electron microscope according to claim 1, wherein said means for measuring a modulation frequency component of current produced in the sample comprises a sample, a load resistor connected in series between ground and a retarding electrode, a high-frequency signal extracting means connected to the sample, a preamplifier connected to an output terminal of the high-frequency signal extracting means, and a band pass filter to extract said modulation frequency component from the preamplifier output.

9. The absorption current image apparatus in the electron microscope according to claim 1, further comprising a means for changing said modulation frequency.

10. The absorption current image apparatus in the electron microscope according to claim 8, wherein said load resistor consists of a resistor or a resistor and a coil which are connected in series or parallel.

11. The absorption current image apparatus in the electron microscope according to claim 8, wherein said high-frequency signal extracting means is a coupling condenser.

12. A method for observing absorption current, using the absorption current image apparatus in the electron microscope as recited in claim 1, whereby said sample is observed under a pressure not less than 270 Pa.

13. A method for observing absorption current, using the absorption current image apparatus in the electron microscope as recited in claim 1, whereby said electron beam produces a probe current not less than 10 nA.

* * * * *